(12) United States Patent
Yajima

(10) Patent No.: US 12,328,115 B2
(45) Date of Patent: Jun. 10, 2025

(54) SWITCHING CIRCUIT AND POWER SUPPLY CIRCUIT

(71) Applicant: JAPAN SCIENCE AND TECHNOLOGY AGENCY, Kawaguchi (JP)

(72) Inventor: Takeaki Yajima, Fukuoka (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 80 days.

(21) Appl. No.: 18/369,461

(22) Filed: Sep. 18, 2023

(65) Prior Publication Data

US 2024/0007102 A1 Jan. 4, 2024

Related U.S. Application Data

(63) Continuation of application No. PCT/JP2022/012286, filed on Mar. 17, 2022.

(30) Foreign Application Priority Data

Mar. 25, 2021 (JP) .................. 2021-051423

(51) Int. Cl.
*H03K 17/687* (2006.01)
*H02M 1/08* (2006.01)
(Continued)

(52) U.S. Cl.
CPC ............ *H03K 17/687* (2013.01); *H02M 1/08* (2013.01); *H02M 3/155* (2013.01); *H02M 7/04* (2013.01); *H03K 17/06* (2013.01); *H03K 17/74* (2013.01)

(58) Field of Classification Search
CPC .................................................. H03K 17/687
(Continued)

(56) References Cited

U.S. PATENT DOCUMENTS

2022/0014179 A1   1/2022   Yajima

FOREIGN PATENT DOCUMENTS

JP   2002-10631 A   1/2002
JP   2014-33494 A   2/2014
(Continued)

OTHER PUBLICATIONS

International Search Report dated May 10, 2022, issued in counterpart International Application No. PCT/JP2022/012286, with English Translation. (6 pages).
(Continued)

*Primary Examiner* — Tomi Skibinski
(74) *Attorney, Agent, or Firm* — WHDA, LLP

(57) ABSTRACT

A switching circuit includes a switching element of a field-effect type, the switching element being configured to switch between an ON state and an OFF state in accordance with a potential of a control terminal, and a control circuit configured to supply a potential of a first level to the control terminal when maintaining one state of the ON state and the OFF state of the switching element, and make the control terminal floating after charging or discharging the control terminal via a resistor and supply a potential of a second level to the control terminal when switching the switching element from the one state to another state of the ON state and the OFF state, the first level bringing the switching element into the one state, the second level bringing the switching element into said another state.

20 Claims, 10 Drawing Sheets

(51) Int. Cl.
  *H02M 3/155* (2006.01)
  *H02M 7/04* (2006.01)
  *H03K 17/06* (2006.01)
  *H03K 17/74* (2006.01)
(58) Field of Classification Search
  USPC .......................................................... 327/427
  See application file for complete search history.

(56) References Cited

FOREIGN PATENT DOCUMENTS

| WO | 00/08759 A1 | 2/2000 | |
|----|----|----|----|
| WO | WO-0008759 A1 * | 2/2000 | ........... H03K 17/063 |
| WO | 2020/175209 A1 | 9/2020 | |

OTHER PUBLICATIONS

Written Opinion of the International Searching Authority (Form PCT/ISA/237) dated May 10, 2022, issued in counterpart International Application No. PCT/JP2022/012286. (4 pages).

* cited by examiner

SWITCHING CIRCUIT AND POWER SUPPLY CIRCUIT

CROSS-REFERENCE TO RELATED APPLICATION

This application is based upon and claims the benefit of priority of the prior International Patent Application No. PCT/JP2022/12286, filed on Mar. 17, 2022, which claims the benefits of priorities of Japanese Patent Application No. 2021-051423 filed on Mar. 25, 2021, the entire contents of which are incorporated herein by reference.

FIELD

The present disclosure relates to a switching circuit and a power supply circuit.

BACKGROUND

There is known a power supply circuit that converts a voltage of electric power generated by a power generation element such as an energy harvesting element and stores the electric power in an electric storage device such as a capacitor. In such a power supply circuit, switching for converting a voltage of electric power is implemented by a field effect transistor (FET) and a control circuit that controls the gate voltage of the FET as disclosed in, for example, Japanese Patent Application Laid-Open No. 2014-33494 (Patent Document 1).

SUMMARY

In Patent Document 1, the gate voltage for turning on a MOSFET (M1) is generated by resistively dividing the voltage between a ground and a node between a power generation element and the MOSFET (M1) by resistors R2 and R3 (see FIG. 1 of Patent Document 1). However, during a period in which the MOSFET (M1) is in an ON state, a current continues to flow through the resistors R2 and R3, resulting in high power consumption. Therefore, use of the power supply circuit of Patent Document 1 in a circuit desired to have low power consumption, for example, a circuit using a so-called energy harvesting element as a power supply element affects the power consumption. This influence occurs not only in the circuit of Patent Document 1 but also in a circuit having a similar switching function.

The present invention has been made in view of the above problem, and an object thereof is to provide a switching circuit and a power supply circuit capable of reducing power consumption.

In one aspect of the present disclosure, there is provided a switching circuit including: a switching element of a field-effect type, the switching element being configured to switch between an ON state and an OFF state in accordance with a potential of a control terminal; and a control circuit configured to supply a potential of a first level to the control terminal when maintaining one state of the ON state and the OFF state of the switching element, and make the control terminal floating after charging or discharging the control terminal via a resistor and supply a potential of a second level to the control terminal when switching the switching element from the one state to another state of the ON state and the OFF state, the first level bringing the switching element into the one state, the second level bringing the switching element into said another state.

In the above configuration, a configuration in which the control circuit makes the control terminal floating when supplying the potential of the first level to the control terminal may be employed.

In the above configuration, a configuration in which the switching element is an element that turns on and off an electromotive force supplied from a power generation element may be employed.

In the above configuration, a configuration in which the switching element is an element that turns on and off power supply to a sensor circuit may be employed.

In the above configuration, a configuration in which a maintaining circuit configured to maintain a potential of the control terminal within a predetermined range is provided may be employed.

In the above configuration, a configuration in which the maintaining circuit includes a diode connected to the control terminal may be employed.

In the above configuration, a configuration in which the switching element is a first FET having a source connected to a first terminal, a drain connected to a second terminal, and a gate connected to a first node capacitively coupled to a first control terminal may be employed.

In the above configuration, a configuration in which a second FET having a source connected to the first node, a drain connected to the first terminal, and a gate is provided, the one state is the OFF state, and the control circuit brings a state between the source and the drain of the second FET into an OFF state to connect the first node to a reference potential via the resistor, and then disconnects the first node from the first terminal and the reference potential and supplies the potential of the second level to the first control terminal when switching the first FET from the OFF state to the ON state may be employed.

In the above configuration, a configuration in which a third FET having a source connected to the reference potential, a drain connected to the first node, and a gate is provided, and the resistor is a resistor between the source and the drain of the third FET, and a saturation current flows through the third FET when the first node is connected to the reference potential via the second FET may be employed.

In the above configuration, a configuration in which a rectifier element in which a direction from the first node to a second node capacitively coupled to a second control terminal is a forward direction is provided, the second FET is of an N-type, and the gate of the second FET is connected to the second node, the first FET is of a P-type, and the first node is connected to the reference potential via the rectifier element, the second node, and the resistor may be employed.

In the above configuration, a configuration in which a rectifier element in which a direction from a second node capacitively coupled to a second control terminal to the first node is a forward direction is provided, the second FET is of a P-type and is connected to a second node capacitively coupled to the second control terminal, the first FET is of an N-type, and the first node is connected to the reference potential via the rectifier element, the second node, and the resistor may be employed.

In the above configuration, a configuration in which the control circuit supplies the potential of the second level to the first control terminal and supplies a potential of a third level to the second control terminal when the first FET is maintained in the ON state, and supplies a potential of a fourth level to the second control terminal and then supplies the potential of the first level to the first control terminal and the potential of the third level to the second control terminal, the potential of the third level bringing the second FET into an OFF state, the potential of the fourth level bringing the second FET into an ON state may be employed.

In the above configuration, a configuration in which the control circuit supplies the potential of the first level to the first control terminal after supplying the potential of the third level to the second control terminal when switching the first FET from the ON state to the OFF state may be employed.

In the above configuration, a configuration in which a determination circuit configured to determine whether an input voltage input to the first terminal has changed by a predetermined voltage from an input voltage when the first FET was switched from the ON state to the OFF state last time, when the first FET is maintained in the OFF state is provided, and the control circuit supplies the second level to the first control terminal and supplies the fourth level to the second control terminal, and then supplies the first level to the first control terminal and supplies the third level to the second control terminal when it is determined that the input voltage has changed by the predetermined voltage may be employed.

In the above configuration, a configuration in which the determination circuit includes a comparator configured to compare a voltage at a third node capacitively coupled to the first terminal with a constant voltage and output a comparison result to the control circuit may be provided.

In the above configuration, a configuration in which an input voltage input to the first terminal is higher than the reference potential, and the first FET is a PFET may be employed.

In the above configuration, a configuration in which an input voltage input to the first terminal is lower than the reference potential, and the first FET is an NFET may be employed.

In the above configuration, a configuration in which the power generation element is a vibration power generation element may be employed.

The present invention is a power supply circuit including the above switching circuit.

DETAILED DESCRIPTION

Hereinafter, embodiments will be described with reference to the drawings.

FIRST EMBODIMENT

Figure 1:
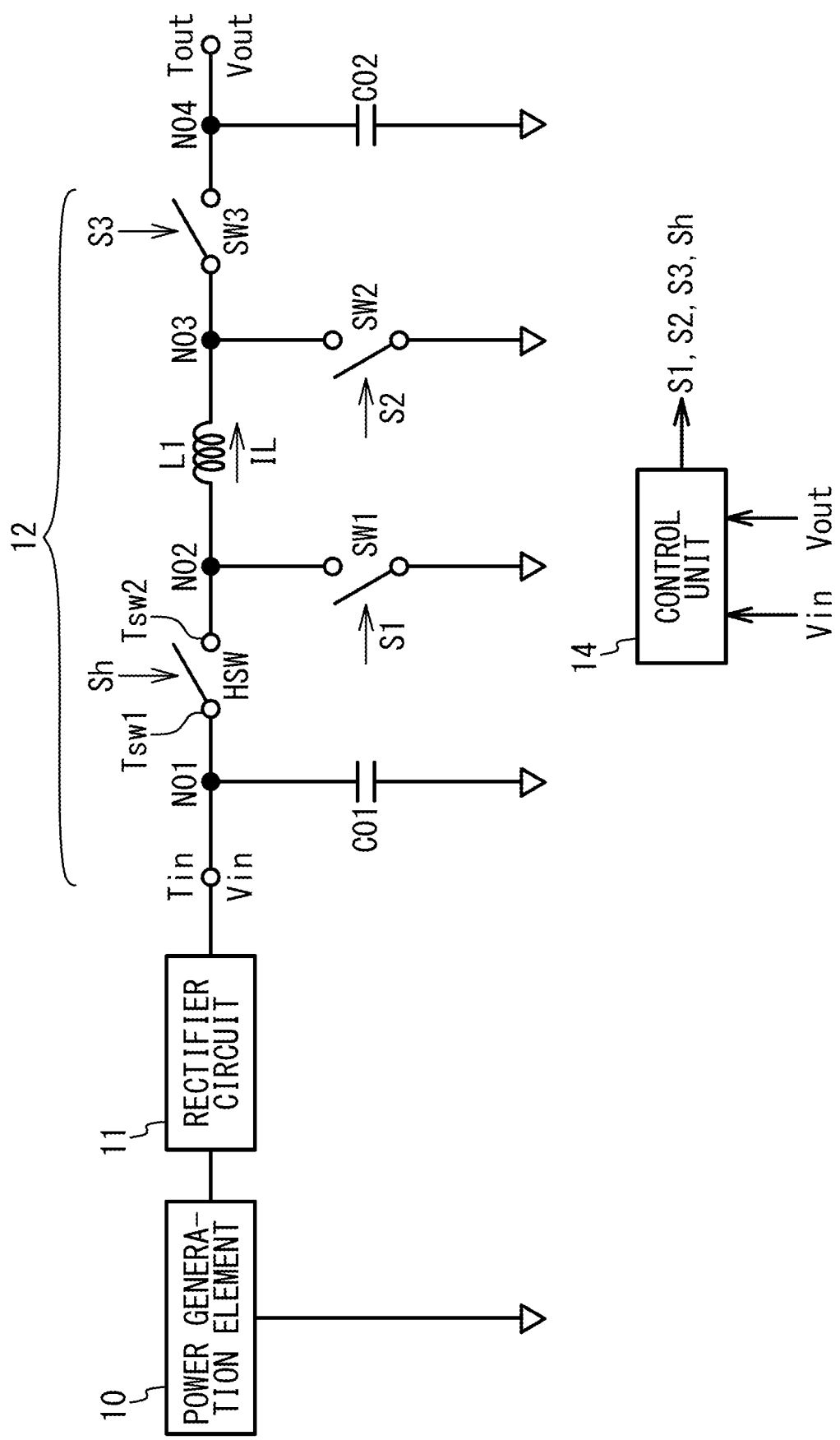
FIG. 1 is a circuit diagram illustrating a first embodiment of a power supply circuit in which a switching circuit illustrated in detail in FIG. 3 is used.
Figure 3:
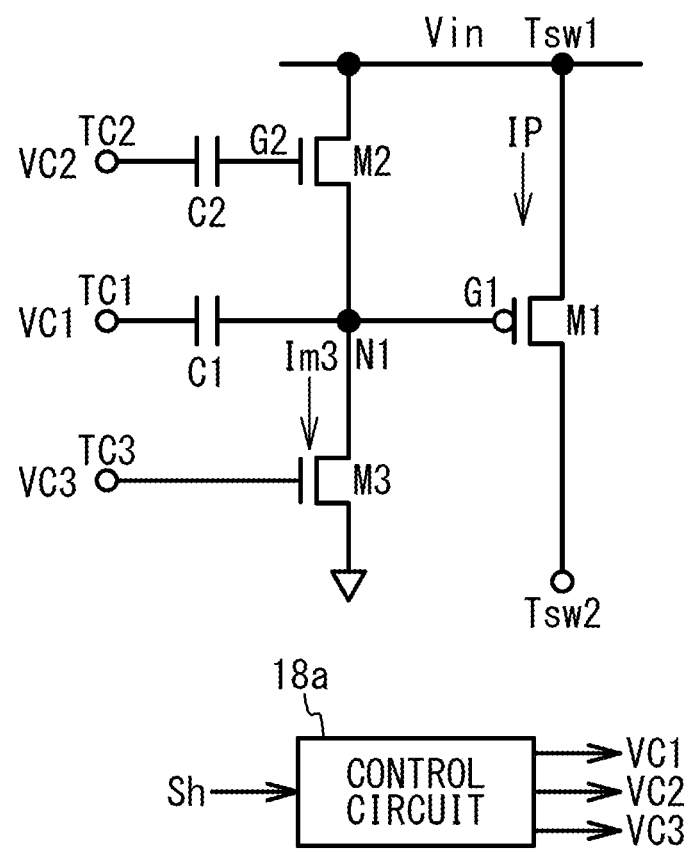
FIG. 3 is a detailed circuit diagram of the switching circuit constituting the power supply circuit of the first embodiment, and is a circuit diagram illustrating the details of the switch indicated as HSW in FIG. 1 and a control circuit thereof.

FIG. 1 is a circuit diagram illustrating a first embodiment of a power supply circuit in which a switching circuit illustrated in detail in FIG. 3 is used. The output current of a power generation element 10 is input to an input terminal Tin of a voltage conversion circuit 12 in FIG. 1. When a power generation element of which the output current is alternating current is used as the power generation element 10, the output current of the power generation element 10 is rectified by a rectifier circuit 11 and is input to the input terminal Tin.

The power generation element 10 is, for example, an energy harvesting element such as a vibration power generation element. The vibration power generation element is, for example, a piezoelectric element using a piezoelectric material or a micro electro mechanical systems (MEMS) element using MEMS. The vibration power generation element is provided on a road, a bridge, or the like, for example, and generates power by vibrations caused by pedestrians or vehicles passing by. When a vibration power generation element is used as the power generation element 10, the generated power is AC micro power and varies with the state of vibration. When a piezoelectric element is used, its output voltage is generally relatively higher than the few volts required for electronic circuit operation. In the first embodiment, the input to the input terminal Tin is positive with respect to the ground because of the rectifier circuit 11.

Nodes N01 to N04 are provided between the input terminal Tin and an output terminal Tout of the voltage conversion circuit 12. The voltage conversion circuit 12 of the present embodiment steps down a relatively high voltage from the power generation element 10 and outputs the stepped-down voltage to the output terminal Tout. A switch HSW is a high-side switch provided at a high-voltage side (referred to as a high side) of the voltage conversion circuit 12. A terminal Tsw1, which is one end of the switch HSW, is connected to the node N01, and a terminal Tsw2, which is the other end, is connected to the node N02. One end of an inductor L1 is connected to the node N02, and the other end thereof is connected to the node N03. One end of a switch SW3 is connected to the node N03, and the other end thereof is connected to the node N04. One end of a capacitor C01 at the primary side of the voltage conversion circuit 12 is connected to the node N01 and the other end thereof is connected to a ground (reference potential). One end of a capacitor C02 at the secondary side of the voltage conversion circuit 12 is connected to the node N04, and the other end thereof is connected to a ground. One end of a switch SW1 is connected to the node N02, and the other end thereof is connected to a ground. One end of a switch SW2 is connected to the node N03, and the other end thereof is connected to a ground.

A control unit 14 outputs control signals Sh and S1 to S3 to the switches HSW and SW1 to SW3, respectively. The switches HSW and SW1 to SW3 are turned on or off based on the control signals Sh and S1 to S3, respectively. In the present embodiment, the control unit 14 generates the control signal Sh in a constant cycle. The frequency thereof is sufficiently higher than the frequency of the alternating-current component included in the electromotive force output from the power generation element 10 and the rectifier circuit 11. The frequency of the control signal Sh is considered so that impedance matching for efficiently transmitting the electromotive force output from the power generation element 10 and the rectifier circuit 11 to the voltage conversion circuit 12 is performed. The control unit 14 may detect voltages Vin and Vout and output the control signals Sh and S1 to S3 based on the voltages Vin and Vout.

When a positive current with respect to the ground is input from the power generation element 10 to the input terminal Tin via the rectifier circuit 11, the capacitor C01 is charged. The potential at the node N01 side of the capacitor C01 with respect to the ground is referred to as the input voltage Vin. By the operation of the voltage conversion circuit 12, that is, the operation of the switch HSW and the switches SW1, SW2, and SW3 in the voltage conversion circuit 12, which will be described later, the electric charge of the capacitor C01 moves to the capacitor C02. The potential at the node N04 side of the capacitor C02 with respect to the ground is referred to as the voltage Vout.

Figure 2:
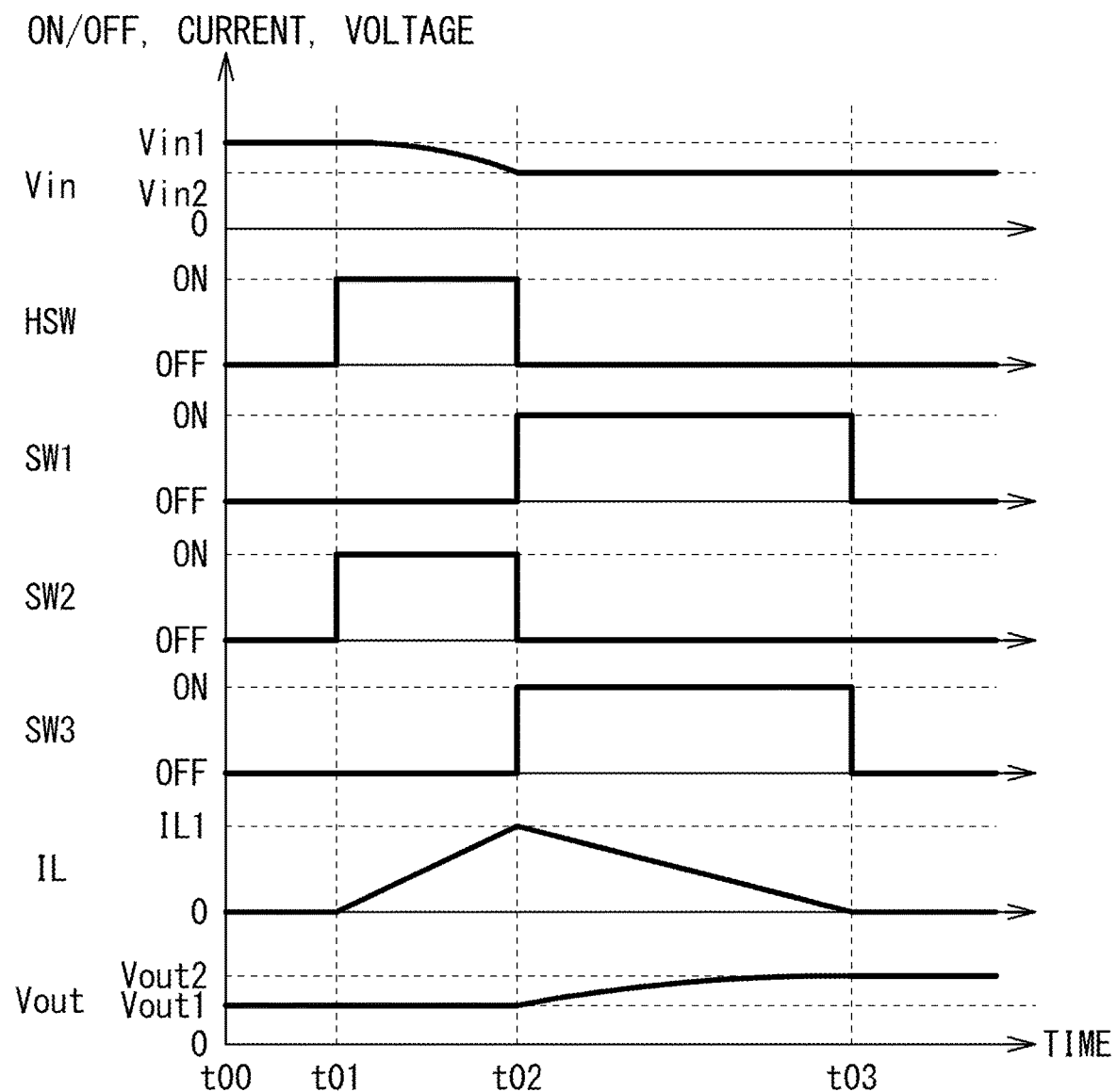
FIG. 2 is a timing chart illustrating ON/OFF of switches constituting a voltage conversion circuit illustrated in FIG. 1 and a current IL flowing through an inductor.

FIG. 2 is a timing chart illustrating ON/OFF of the switches constituting the voltage conversion circuit illustrated in FIG. 1 and a current IL flowing through the inductor. FIG. 2 presents the value of the input voltage Vin, the ON and OFF states of each switch illustrated in FIG. 1, the current IL flowing through the inductor L1, and the value of the output voltage Vout. Time t00 in FIG. 2 is a certain timing during the operation of the power supply circuit, and at that time, the current from the power generation element 10 is stored in the capacitor C01 the voltage Vin thereof is a voltage Vin1, the charge is also stored in the capacitor C02 by the voltage conversion operation described later, and the voltage Vout thereof is a voltage Vout1. At time t00, the control unit 14 maintains the switches HSW and SW1 to SW3 in the OFF state.

After the electric charge stored in the capacitor C01 is increased by the current generated by the power generation element 10 and the voltage Vin exceeds a predetermined threshold voltage, the control unit 14 turns on the switches HSW and SW2 at time t01 and maintains the OFF states of the switches SW1 and SW3. As a result, the current IL starts to flow from the capacitor C01 to the ground via the node N01, the switch HSW, the inductor L1, and the switch SW2. The control unit 14 may detect the voltage Vin at the input terminal Tin and turn on the switches HSW and SW2 when the voltage Vin exceeds a predetermined threshold voltage, or turn on the switches HSW and SW2 in a predetermined cycle. Between time t01 and time t02, the current IL gradually increases and the voltage Vin gradually decreases as the electric charge of the capacitor C01 is released. Magnetic field energy is stored in the inductor L1.

At time t02, the voltage Vin becomes a voltage Vin2. The voltage Vout is the voltage Vout1. When the current IL becomes IL1 at time t02, the control unit 14 turns off the switches HSW and SW2 and turns on the switches SW1 and SW3. The control unit 14 may detect the voltage Vin at the input terminal Tin and turn off the switches HSW and SW2 and turn on the switches SW1 and SW3 when the voltage Vin becomes Vin2, or may turn off the switches HSW and SW2 and turn on the switches SW1 and SW3 in a predetermined cycle. Between time t02 and time t03, the current IL flows from the ground through the switch SW1, the inductor L1, and the switch SW3 because of the magnetic field energy stored in the inductor L1, and the voltage Vout increases as the capacitor C02 is charged.

At time t03, the control unit 14 turns off the switches SW1 and SW3, and maintains the OFF states of the switches HSW and SW2. The control unit 14 may detect the voltage Vout at the output terminal Tout and turn off the switches SW1 and SW3 when the voltage Vout reaches a predetermined threshold voltage, or may turn off the switches SW1 and SW3 in a predetermined cycle. After time t03, the current IL is 0, the voltage Vin is the voltage Vin2, and the voltage Vout is a voltage Vout2. The voltages Vout1 and Vout2 may be lower or higher than the voltages Vin1 and Vin2. By appropriately setting the capacitance values of the capacitors C01 and C02 and the ON/OFF timings of the switches HSW and SW1 to SW3, the voltages Vout1 and Vout2 can be set.

FIG. 3 is a detailed circuit diagram of the switching circuit constituting the power supply circuit of the first embodiment, and is a circuit diagram illustrating the details of the switch indicated as HSW in FIG. 1 and a control circuit thereof. Hereinafter, an FET of which the conductivity type of the channel is a P-type is referred to as a PFET, and an FET of which the conductivity type of the channel is an N-type is referred to as an NFET. The ON/OFF of a PFET M1 corresponds to the ON/OFF of the switch HSW. As illustrated in FIG. 3, in a switching circuit 25 of the first embodiment, the source of the PFET M1 (first FET) is connected to the terminal Tsw1 (first terminal), the drain is connected to the terminal Tsw2 (second terminal), and the gate is connected to a node N1 (first node). A capacitor C1 (first capacitor) has one end to which a control signal VC1 (first control signal) is input, and the other end connected to the node N1. That is, the gate is capacitively coupled to a control terminal TC1 (first control terminal). The source of an NFET M2 (second FET) is connected to the node N1, the drain is connected to the terminal Tsw1, and the gate is connected to a control terminal TC2 to which a control signal VC2 is input via a capacitor C2 (second capacitor). The source of an NFET M3 (third FET) is connected to a ground (reference potential), the drain is connected to the node N1, and the gate is connected to a control terminal TC3 to which a control signal VC3 is input. The control signal Sh output from the control unit 14 of FIG. 1 is input to a control circuit 18a. The control circuit 18a controls the states of the PFET M1, the NFET M2, and the NFET M3 by changing the levels of the control signals VC1, VC2, and VC3 at a timing based on the control signal Sh.

Figure 4:
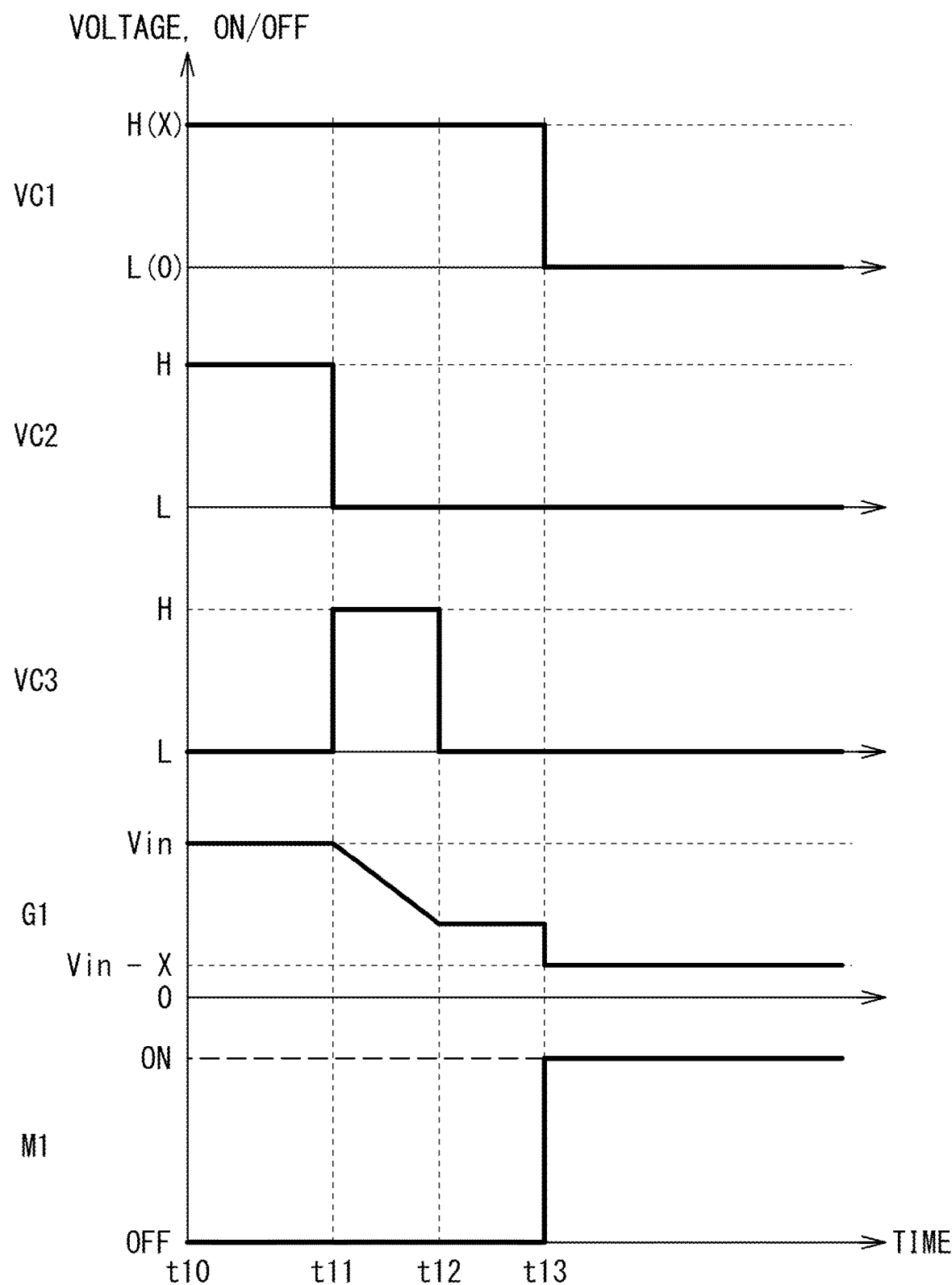
FIG. 4 is a timing chart illustrating temporal changes of voltages and ON/OFF in the switching circuit illustrated in FIG. 3.

FIG. 4 is a timing chart illustrating temporal changes of voltages and ON/OFF in the switching circuit illustrated in FIG. 3. As illustrated in FIG. 4, the control circuit 18a sets the control signal VC1 at a high level H (voltage X), the control signal VC2 at the high level H, and the control signal VC3 at a low level L between time t10 and time t11, which is a period during which the switch HSW maintains the OFF state. Since the NFET M2 is in the ON state, the voltage G1 is the voltage Vin, and the PFET M1 is in the OFF state.

The control unit 14 of FIG. 1 detects the voltage Vin at the input terminal Tin, and outputs an instruction, as the control signal Sh, to switch the switch HSW from the OFF state to the ON state when determining that the voltage Vin exceeds a predetermined threshold voltage at time t01 of FIG. 2. The control unit 14 may output the control signal Sh for switching the switch HSW from the OFF state to the ON state in a predetermined cycle. When the control signal Sh issues an instruction to switch the switch HSW from the OFF state to the ON state, the control circuit 18a performs an operation of switching the PFET M1 from the OFF state to the ON state between time t11 and time t13. At time t11, the control circuit 18a sets the control signal VC2 at the low level L, sets the control signal VC3 at the high level H, and maintains the control signal VC1 at the high level H. As a result, the NFET M2 is turned off and the NFET M3 is turned on. A current Im3 flows from the node N1 to the ground. When the voltage difference between the node N1 and the ground is in a saturation region of the NFET M3 (a region where the drain current is saturated), the current Im3 is substantially constant regardless of the voltage difference between the node N1 and the ground. As a result, the voltage G1 at the node N1 gradually decreases due to the current Im3 between time t11 and time t12 in FIG. 4.

When determining that a predetermined time period has elapsed from time t11, the control circuit 18a sets the control signal VC3 at the low level L, maintains the control signal VC1 at the high level H, and maintains the control signal VC2 at the low level L at time t12. The NFET M3 is turned off. Between time t12 and time t13, the voltage G1 is substantially constant. When determining that a predetermined time period has elapsed from time t12, the control circuit 18a sets the control signal VC1 at the low level L, maintains the control signal VC3 at the low level L, and maintains the control signal VC2 at the low level L at time t13. As a result, the voltage G1 drops from the voltage Vin by a voltage difference X (a difference between the high level H and the low level L of the control signal VC1) and becomes a voltage Vin−X. The PFET M1 is turned on. Since a current IP flows through the inductor L1 in FIG. 1, the current IP gradually increases after time t12. Thus, the NFET M2 is in the OFF state when the PFET M1 maintains the ON state. After time t12, the node N1 is in a floating state. However, if the time period between time t12 and time t13 is short, for example, about several microseconds, the fluctuation of the voltage G1 does not substantially cause a problem. In order to set the voltage G1 at the voltage Vin−X, the timing at which the control signal VC1 is set at the low level L is preferably after the timing at which the control signal VC3 is set at the low level L.

As described above, in the first embodiment, the control circuit 18a charges or discharges the node N1 through the resistor (NFET M3) when the PFET M1 is turned on from the OFF state. Thereafter, the node N1 is made floating (time t12), and after a predetermined time, the control signal VC1 is set at the low level L (second level that causes the PFET M1 to be turned on) (time t13). This turns on the PFET M1. Although a current flows through the NFET M3 between time t11 and time t12, the potential of the node N1 is floating since the NFET M3 is in the OFF state after time t13. Therefore, no current flows between the terminal Tsw1 and the ground. Therefore, power consumption can be reduced as compared with a case where a current continues to flow through the resistors R2 and R3 during a period in which the MOSFET (M1) (see FIG. 1 of Patent Document 1) is in the ON state as in Patent Document 1.

When the control circuit 18a changes the state of the PFET M1 from the OFF state to the ON state, the control circuit 18a turns off the NFET M2, disconnects the node N1 from the terminal Tsw1 (time t11), and then connects the node N1 to the ground through the NFET M3 (between time t11 and time t12). Thereafter, the control circuit 18a disconnects the node N1 from the ground (time t12) and supplies the low level L to the control terminal TC1 (time t13). As a result, the voltage G1 can be stably set to the voltage Vin−X by a decrease in the voltage G1 due to the capacitive coupling of the capacitor C1 and a decrease in the voltage G1 due to the current Im3 of the NFET M3. Therefore, the PFET M1 can be stably switched from the OFF state to the ON state. This allows the voltage conversion circuit 12 to operate stably when the voltage conversion circuit 12 is to operate, improving the conversion efficiency.

Here, in the present embodiment, a PFET may be used for the third FET corresponding to the NFET M3. In order to use the PFET for the third FET, the control signal VC3 for turning on the first switch is set at a voltage G1−X. Since the voltage G1 varies as illustrated in the graph of FIG. 4, a generation circuit that generates the control signal VC3 following the variation in the voltage G1 is provided. On the other hand, in the case that an NFET is used for the third FET corresponding to the NFET M3, the control signal VC3 is only required to be set at a constant voltage (high level H) with respect to the ground when the third FET is turned on, and the control signal VC3 can be easily generated. Therefore, the first switch can be stably turned on at a predetermined timing. When the NFET is used for the first switch, the above-described generation circuit is not required as compared with the case where the PFET is used, and the power consumption of the generation circuit does not increase the power consumption of the entire power supply circuit. In the case that an NFET is used for the third FET, the control circuit 18a is configured to output the control signal VC3, which has a voltage value set so that a saturation current flows between the source and the drain of the NFET M3, when the control signal VC3 is at the high level H (first level). This configuration allows the current Im3 to be constant independent of the voltage difference between the node N1 and the ground. Therefore, by setting the interval between time t11 and time t12, a decrease in the voltage G1 at time t12 from that at time t11 can be made substantially constant regardless of the voltage value of the voltage Vin. Therefore, the voltage G1 at time t13 can be set to substantially the voltage Vin−X independent of the voltage value of the voltage Vin. Therefore, the PFET M1 can be stably switched from the OFF state to the ON state. This allows the voltage conversion circuit 12 to operate when the voltage conversion circuit 12 is to operate, improving the conversion efficiency.

Here, in the present embodiment, a PFET may be used for the second FET corresponding to the NFET M2. In order to use the PFET for the second FET, a generation circuit for generating the voltage Vin−X as the control signal VC2 for turning on the second FET is provided. On the other hand, in the case that an NFET is used for the second switch corresponding to the NFET M2, the control signal VC2 is only required to be set at the voltage G1 or a constant voltage (high level H) with respect to the ground when the second FET is turned on, and the control signal VC2 is easily generated. Therefore, the second FET can be stably turned on at a predetermined timing. In the case that an NFET is used for the second FET, the above-described generation circuit is not required as compared with the case where the PFET is used, and the power consumption of the generation circuit does not increase the power consumption of the entire power supply circuit.

In the first embodiment described above, the PFET M1 in FIG. 3 is the first FET having the first terminal Tsw1 connected to the power generation element 10, the second terminal Tsw2, the source connected to the first terminal Tsw1, the drain connected to the second terminal Tsw2, and the gate connected to the first node N1 capacitively coupled to the first control terminal TC2.

The control circuit that supplies the first level, which brings the first FET M1 into one state of the OFF state and the ON state, to the first control terminal TC1 when the first FET M1 maintains the one state, and charges or discharges the first node N1 through the resistor, then makes the first node N1 floating, and supplies the second level, which brings the first FET M1 into the other state of the OFF state and the ON state, to the first control terminal TC1 when changing the state of the first FET M1 from the one state to the other state is composed of the NFET M2, the NFET M3, and the control circuit 18a that supplies VC1, VC2, and VC3.

In the present embodiment, the control signal Sh has a constant period, and its frequency is sufficiently higher than the frequency of the alternating-current component included in the electromotive force output from the power generation element 10 and the rectifier circuit 11. However, the power consumption of the FETs M1 to M3 increases in proportion to increase in frequency of the control signal Sh. Therefore, in order to transmit the electric power generated by the power generation element 10 to the capacitor C02 in the subsequent stage as efficiently as possible, the frequency of the control signal Sh is preferably low.

Although the control signal Sh is generated in a constant cycle in the first embodiment as described above, the control signal Sh may be generated not in a constant cycle but when a comparator detects that the voltage of the secondary-side capacitor C2 (node N04) has reached a predetermined voltage required for driving the load. Alternatively, the control signal Sh may be generated when a comparator detects that the voltage of the primary-side capacitor C01 (node N01) has reached a predetermined voltage. In FIG. 4, the control signal VC3 may become at the high level H after a switch SW5 is turned off.

In a first variation of the first embodiment, the control terminal TC2 and the NFET M2 are capacitively coupled to each other. As a result, when the control circuit 18a switches the control signal VC2 from the low level L to the high level H, a voltage G2 of the gate of the NFET M2 becomes the high level H. This turns on the NFET M2. However, since the gate of the NFET M2 is floating, the voltage G2 is not stable.

SECOND EMBODIMENT

In the first embodiment, there may be a case where the voltage G2 is not stable during a certain period in which the gate of the NFET M2 is floating, depending on the circuit constant such as the cycle in which the control signal VC1 is switched between the high level and the low level or the saturation current value between the source and the drain of the NFET M3. In this case, there is a possibility that the operation of the switch HSW (PFET M1) is not stable and the power supply circuit as a whole does not exhibit desired performances. In a second embodiment, a switching circuit that exhibits desired performance as a power supply circuit even in such a case will be described.

Figure 5:
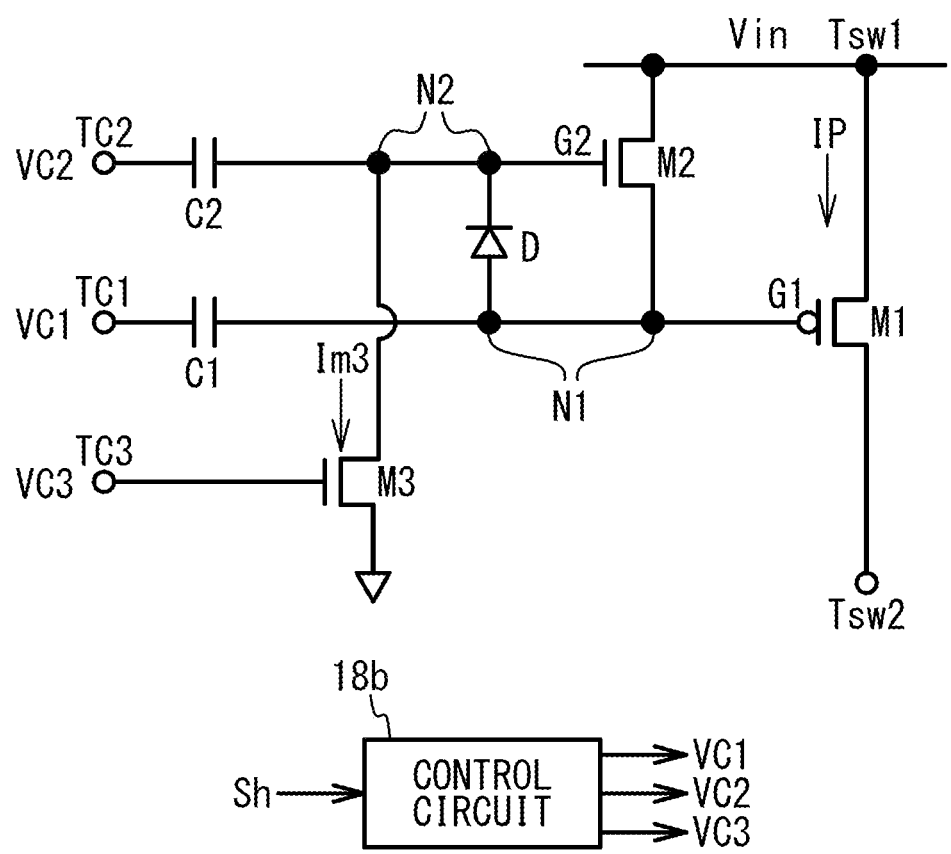
FIG. 5 is a detailed circuit diagram of a switching circuit constituting a power supply circuit of a second embodiment, and is a circuit diagram illustrating the details of a switch indicated as HSW in FIG. 1 and a control circuit thereof.

FIG. 5 is a detailed circuit diagram of a switching circuit constituting a power supply circuit of the second embodiment, and is a circuit diagram illustrating the details of the switch indicated as HSW in FIG. 1 and a control circuit thereof. As illustrated in FIG. 5, in a switching circuit 26 of the second embodiment, the control signal VC2 is input to one end of the capacitor C2 (second capacitor), and the other end thereof is connected to a node N2 (second node). A diode D (rectifier element) has an anode connected to the node N1 and a cathode connected to the node N2 between the NFET M2 and the capacitor C2. The direction from the node N1 to the node N2 is a forward direction. The drain of the NFET M3 is connected to the node N1 via the node N2 and the diode D. The NFET M2 (second FET) has a source connected to the node N1, a drain connected to the terminal Tsw1, and a gate connected to the node N1 capacitively coupled to the control terminal TC2 (second control terminal). Other configurations as the power supply circuit is the same as those of the first embodiment, and the description thereof is omitted.

Figure 6:
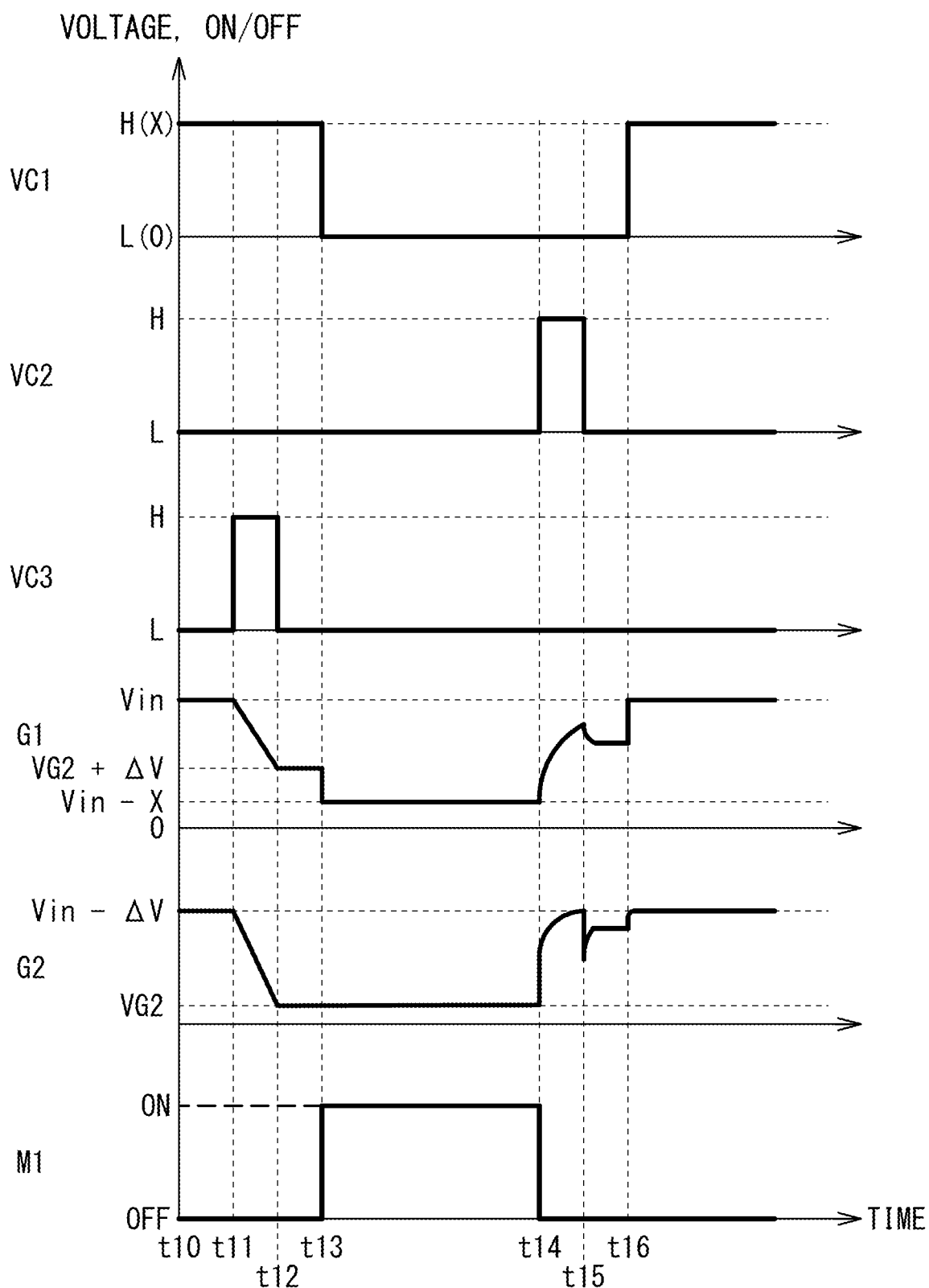
FIG. 6 is a timing chart illustrating temporal changes of voltages and ON/OFF in the switching circuit illustrated in FIG. 5.

FIG. 6 is a timing chart illustrating temporal changes of voltages and ON/OFF in the switching circuit illustrated in FIG. 5. As illustrated in FIG. 6, a control circuit 18b sets the control signal VC1 at the high level H (voltage X), the control signal VC2 at the low level L, and the control signal VC3 at the low level L between time t10 and time t11 during which the switch HSW maintains the OFF state. The voltage G1 is set to the voltage Vin in the same state as that after time t16. The voltage G2 is a voltage Vin−ΔV. ΔV is the forward voltage drop of the diode D.

When the control signal Sh instructs the switch HSW to switch from the OFF state to the ON state, the control circuit 18b performs an operation of switching the PFET M1 from the OFF state to the ON state between time t11 and time t13. At time t11, the control circuit 18b raises the control signal VC3 to the high level H, while maintaining the control signals VC1 and VC2 at the high level H and the low level L, respectively. As a result, the NFET M3 is turned on, and the current Im3 flows from the nodes N2 and N1 to the ground. Between time t11 and time t12, the voltage G2 decreases due to the current Im3, and the current flows from the node N1 to the node N2 via the diode D, and thereby, the voltage G1 decreases.

At time t12, the control circuit 18b sets the control signal VC3 at the low level L, and maintains the control signals VC1 and VC2 at the high level H and the low level L, respectively. The NFET M3 is turned off. The voltage G2 becomes VG2. The voltage G1 becomes VG2+ΔV. Between time t12 and time t13, the voltage G1 is substantially constant. At time t13, the control circuit 18b sets the control signal VC1 at the low level L and maintains the control signals VC2 and VC3 at the low level L. As a result, the voltage G1 becomes the voltage Vin−X. The PFET M1 is turned on and the current IP flows. Between time t13 and time t14 during which the switch HSW maintains the ON state, the control circuit 18b sets the control signals VC1 to VC3 at the low level L.

The control unit 14 of FIG. 1 detects the voltage Vin at the input terminal Tin, and outputs an instruction, as the control signal Sh, to switch the switch HSW from the ON state to the OFF state when it is determined that the voltage Vin has reached a predetermined voltage at time t02 of FIG. 2. The control unit 14 may output the control signal Sh for switching the switch HSW from the ON state to the OFF state in a predetermined cycle. When the control signal Sh instructs the switch HSW to switch from the ON state to the OFF state, the control circuit 18b performs an operation of switching the PFET M1 from the ON state to the OFF state between time t14 and time t16. At time t14, the control circuit 18b sets the control signal VC2 at the high level H and maintains the control signals VC1 and VC3 at the low level L. Between time t14 and time t15, the voltage G2 of the node N2 capacitively coupled to the control terminal TC2 rises. Since the NFET M2 is turned on, the voltage G1 gradually increases. When the voltage G1 becomes equal to or greater than the threshold voltage of the PFET M1, the PFET M1 is turned off and the current IP becomes 0. When the time at which the voltage G1 becomes equal to or greater than the threshold voltage of the PFET M1 is later than time t14, the PFEM1 is turned on at time later than time t14.

At time t15, the control circuit 18b sets the control signal VC2 at the low level L and maintains the control signals VC1 and VC3 at the low level L. The voltage G2 decreases. When the voltage G2 becomes lower than the voltage G1−ΔV, a current flows from the node N1 to the node N2 via the diode D. As a result, the voltage G1 slightly decreases, the voltage G2 slightly increases, and the voltages G1 and G2 becomes voltages in equilibrium.

At time t16, the control circuit 18b sets the control signal VC1 at the high level H and maintains the control signals VC2 and VC3 at the low level L. The voltage G1 at the node N1 capacitively coupled to the control terminal TC1 increases. A current flows from the node N1 to the node N2 via the diode D, and the voltage G2 increases. Since the NFET M2 is completely turned on, the voltage G1 becomes the voltage Vin. The voltage G2 becomes the voltage Vin−ΔV. Since the voltage G2 is stabilized, the voltage G1 is stabilized and the PFET M1 is stabilized in the OFF state.

In the second embodiment, the control circuit 18b charges or discharges the node N2 via a resistor (that is, the resistor between the source and the drain of the NFET M2) when the state of the PFET M1 is changed from the ON state to the OFF state in addition to when the state of the PFET M1 is changed from the OFF state to the ON state (between time t14 and time t15). Thereafter, the control circuit 18b makes the node N2 floating (time t15) and supplies the low level L to the control terminal TC2 (at time t16). As described above, in the second embodiment, when the PFET M1 maintains one state of the OFF state and the ON state, the control circuit 18b supplies a potential of a first level (a level that brings the PFET M1 into one state of the OFF state and the ON state) to the control terminal TC1. When the state of the PFET M1 is changed from one state of the OFF state and the ON state to the other state of the OFF state and the ON state, the control circuit 18b charges or discharges the node N1 via the resistor (between time t11 and time t12 and between time t14 and time t15). Thereafter, the control circuit 18b makes the node N1 floating (at time t12 and at time t15), and supplies a potential of a second level (a level that brings the PFET M1 into the other state of the OFF state and the ON state) to the control terminal TC1 (at time t13 and at time t16).

As described above, the PFET M1 (switching element) is an electric-field-controlled switching element that switches between the ON state and the OFF state in accordance with the potential (voltage G1) of the gate serving as the control terminal. When maintaining the state of the PFET M1, the control circuit 18b supplies, to the gate, a potential of a first level that brings the PFET M1 into one state of the OFF state and the ON state. When the state of the PFET M1 is changed from the one state to the other state of the OFF state and the ON state, the gate is charged or discharged through a resistor and then made floating, and a potential of a second level that brings the PFET M1 into the other state is supplied. Thus, when the PFET M1 maintains the ON state or the OFF state, the node N1 is floating, and thereby, power consumption can be reduced.

In the second embodiment, the capacitor C2, the diode D, and the NFET M2 are provided as a maintaining circuit that maintains the voltage G1 within a predetermined range. Thus, when the PFET M1 is switched from the OFF state to the ON state, if the NFET M3 is turned on from time t11 to time t12, a current flows from the node N1 to the ground via the diode D and the node N2, and thereby, the voltages G1 and G2 decrease. Therefore, regardless of the voltage value of the voltage Vin, the NFET M2 can be switched from the ON state to the OFF state, and the PFET M1 can be switched from the OFF state to the ON state.

The control circuit 18b supplies the low level L (second level) to the control terminal TC1 and supplies a potential of the low level L (third level that brings the NFET M3 into the OFF state) to the control terminal TC2 when the PFET M1 maintains the ON state as at time t13 and time t14. When the control circuit 18b changes the state of the PFET M1 from the ON state to the OFF state as from time t14 to time t16, the control circuit PFET M1 supplies the high level H to the control terminal TC2 (fourth level that turns on the NFET M3), then supplies the low level (third level) to the control terminal TC2, and then supplies the high level H (first level) to the control terminal TC1. When the control signal VC2 becomes the high level H and the voltage G2 rises, the NFET M2 is turned on to raise the voltages G1 and G2. Thereafter, by setting the control signal VC1 at the high level H, the voltage G1 can be further increased. This allows the voltage G1 to be stabilized at the voltage Vin, and the voltage G2 at the voltage Vin−ΔV.

The control circuit 18b supplies the low level L (third level) to the control terminal TC2 at time t15 and then supplies the high level H (first level) to the control terminal TC1 at time t16 after a predetermined period of time elapses when changing the state of the PFET M1 from the ON state to the OFF state. Thus, the high level H (second level) can be supplied to the control terminal TC1 after the transient response of the voltage G2 via the capacitor C2 is stabilized. Therefore, the voltages G1 and G2 become more stable. Thus, when the PFET M1 is switched from the ON state to the OFF state, the PFET M1 can be stably switched to the OFF state. Therefore, it is possible to prevent an unintended current from flowing through the voltage conversion circuit 12, and to improve the conversion efficiency in the voltage conversion circuit 12.

The high level H of the control signal VC2 is, for example, 2 V, and the high level H of the control signal VC1 is, for example, 1 V. As described above, the high level H of the control signal VC2 is preferably higher than the high level H of the control signal VC1. This configuration allows the voltage G2 to be further increased between time t14 and time t15. As a result, the PFET M1 can be turned off more stably, and thereby, the conversion efficiency in the voltage conversion circuit 12 can be improved.

THIRD EMBODIMENT

Figure 7:
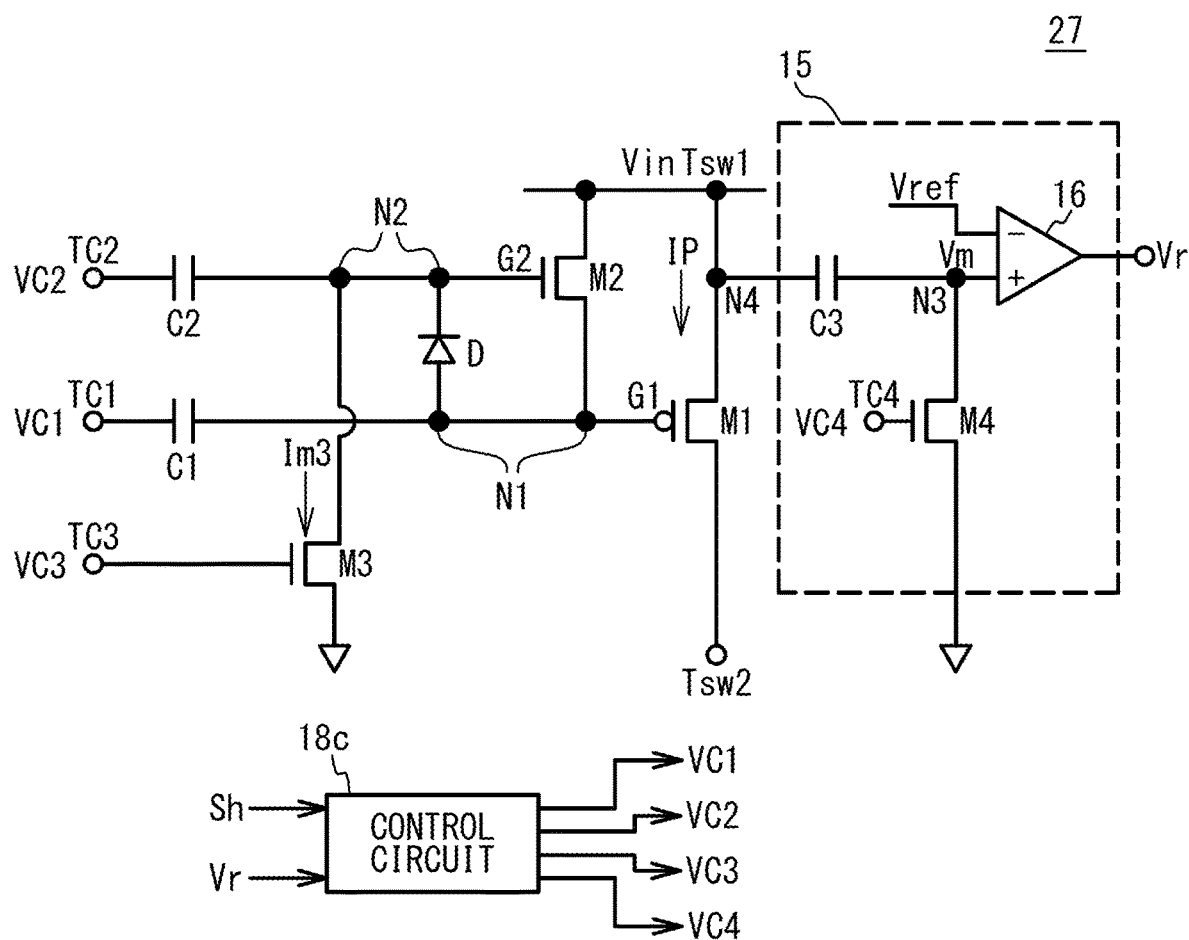
FIG. 7 is a detailed circuit diagram of a switching circuit constituting a power supply circuit in accordance with a third embodiment, and is a circuit diagram illustrating the details of a switch indicated as HSW in FIG. 1 and a control circuit thereof.

FIG. 7 is a detailed circuit diagram of a switching circuit constituting the power supply circuit in accordance with a third embodiment, and is a circuit diagram illustrating the details of the switch indicated as HSW in FIG. 1 and a control circuit thereof. In the first and second embodiments, the control signal Sh has a constant period, and the frequency thereof is sufficiently higher than the frequency of the alternating-current component included in the electromotive force output from the power generation element 10 and the rectifier circuit 11. The power consumption of the FETs M1 to M3 increases in proportion to the increase in the frequency of the control signal Sh. Therefore, the frequency of the control signal Sh is preferably lower in order to transmit the power generated in the power generation element 10 to the capacitor C02 in the subsequent stage as efficiently as possible. However, during a period in which the electromotive force of the power generation element 10 is large and the switch HSW is in the OFF state among the period in which the control signal Sh is the high level and the period in which the control signal Sh is the low level, that is, during a period in which a voltage that does not cause a current to flow between the source and the drain of the FET M1 is set in the node N1 so that the voltage is supplied in a floating state, when the voltage Vin rises greatly (by, for example 0.3 V or greater) and becomes the voltage that causes a micro current to flow between the source and the drain of the FET M1, the electric charge of the capacitor C01 does not contribute to voltage conversion by that micro current, and the voltage conversion efficiency may decrease.

To further improve the voltage conversion efficiency in view of such possibility, as illustrated in FIG. 7, in a switching circuit 27 of the third embodiment, a determination circuit 15 includes a comparator 16, an NFET M4, and a capacitor C3, and outputs a reset signal Vr to a control circuit 18c when the voltage Vin varies to Vref or greater. This reset signal Vr resets the gate potential of the PFET M1 to the same potential as the voltage Vin, similar to the control signal Sh in the second embodiment. In FIG. 7, one end of a capacitor C3 is connected to a node N4 between the source of the PFET M1 and the terminal Tsw1, and the other end thereof is connected to a node N3 (third node). That is, the node N3 is capacitively coupled to the terminal Tsw1. The NFET M4 has a source connected to a ground, a drain connected to the node N3, and a gate connected to a control terminal TC4 to which a control signal VC4 is input. The comparator 16 has a positive input terminal connected to the node N3, a negative input terminal to which the reference voltage Vref is input, and an output terminal that outputs the reset signal Vr. The comparator 16 outputs the high level H as the reset signal Vr when a voltage Vm at the node N3 is equal to or higher than the reference voltage Vref, and outputs the low level L as the reset signal Vr when the voltage Vm is lower than the reference voltage Vref. The reference voltage Vref is, for example, 0.3 V.

The control signal Sh output from the control unit 14 and the reset signal Vr output from the comparator 16 are input to the control circuit 18c. The control circuit 18c outputs the control signals VC1 to VC4 based on the control signal Sh and the reset signal Vr. Other configurations are the same as those of the second embodiment, and the description thereof will be omitted.

Figure 8:
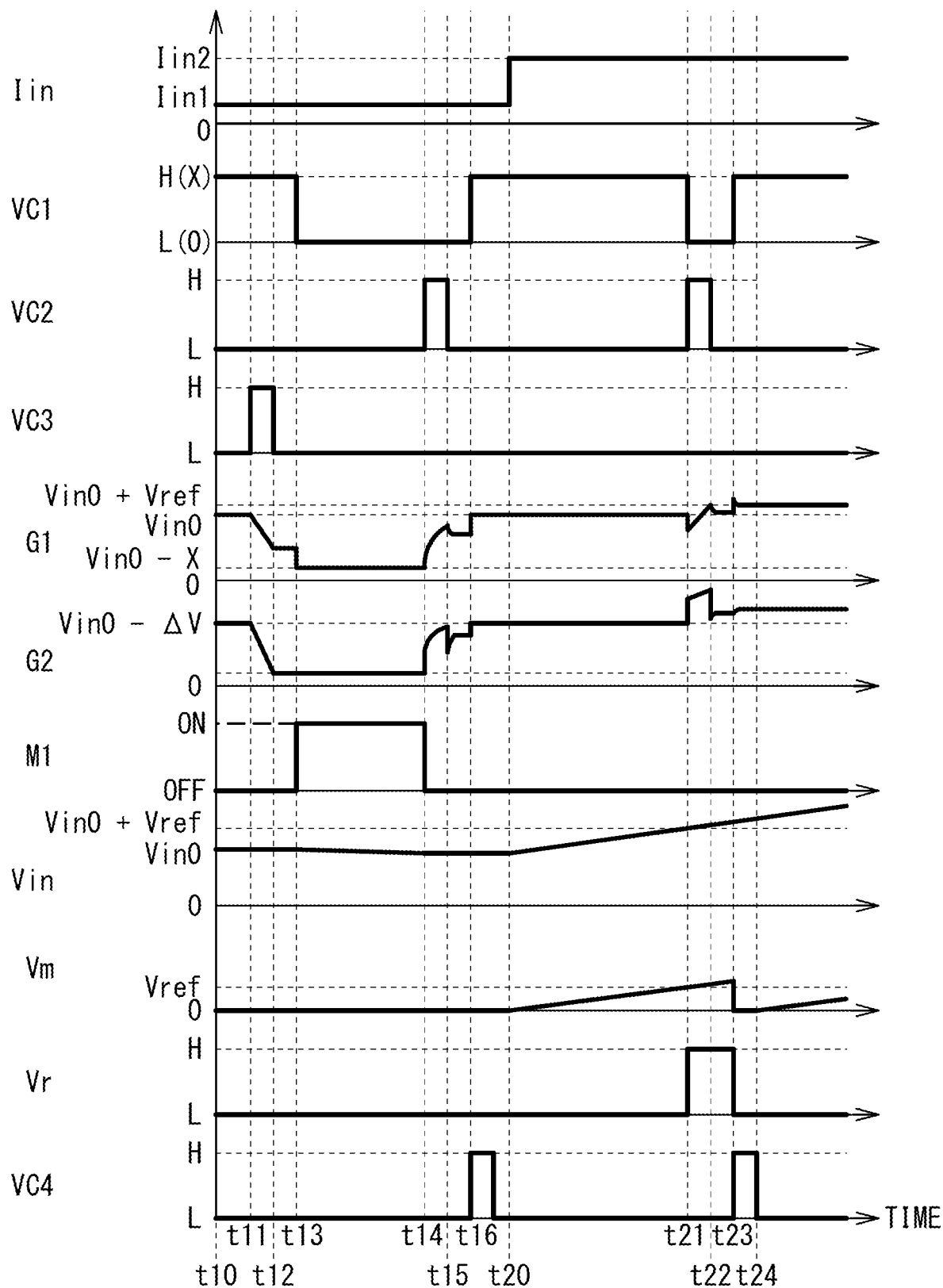
FIG. 8 is a timing chart illustrating temporal changes of voltages, current, and ON/OFF in the switching circuit illustrated in FIG. 7.

FIG. 8 is a timing chart illustrating temporal changes of voltages, currents and ON/OFF in the switching circuit illustrated in FIG. 7. As illustrated in FIG. 8, an input current Iin1 input from the rectifier circuit 11 to the terminal Tsw1 varies depending on the power generation amount of the power generation element 10, but here, the input current Iin is set to Iin1, which is very small, until time t20, and is set to Iin2 after time t20. In this timing chart, the current tint hardly affects the voltage Vin and the like. Therefore, the voltage Vin is substantially constant from time t10 to time t13 and from time t14 to time t20. Between time t13 and time t14, the charge moves from the capacitor C1 to the capacitor C2, and thereby, the voltage Vin slightly decreases. Other changes of the control signals VC1 to VC3, the voltages G1 and G2, and the current Ip between time t10 and time t16 are the same as those in FIG. 6 of the second embodiment, and the description thereof will be omitted. Since the NFET M4 is turned on at a predetermined timing as described later, the voltage Vm at time t10 is 0. The control signal VC4 between time t10 to time t16 is at the low level L, and the reset signal Vr is maintained at the low level L.

After time t20, as the current Iin from the power generation element 10 rises to Iin2 and the voltage Vin gradually increases from a voltage Vin0, the voltage of the node N4 gradually increases. The voltage Vm at the node N3 capacitively coupled to the node N4 gradually increases from 0.

At time t21, the control circuit 18c detects the voltage Vin at the terminal Tsw1, and when the voltage Vin exceeds the voltage Vin0+Vref, the voltage Vm exceeds the reference voltage Vref, and the comparator 16 outputs the high level H as the reset signal Vr. When the reset signal Vr becomes the high level H, the control circuit 18c sets the control signal VC1 at the low level L and sets the control signal VC2 at the high level H, while maintaining the control signals VC3 and VC4 at the low level L. The voltage G1 at the node N1 capacitively coupled to the control terminal TC1 drops. The voltage G2 at the node N2 capacitively coupled to the control terminal TC2 rises. Note that the timing at which the control signal VC1 is set at the low level L and the timing at which the control signal VC2 is set at the high level H may be slightly different from each other as long as the above-described operation is possible.

Between time t21 and time t22, a current flows from the node N1 to the node N2 via the diode D, and the voltages G1 and G2 slightly increase. At time t22, the control circuit 18c sets the control signal VC2 at the low level L, and maintains the control signals VC1, VC3, and VC4 at the low level L. The voltage G2 at the node N2 capacitively coupled to the control terminal TC2 drops. A current flows from the node N1 to the node N2 via the diode D, and the voltage G1 slightly decreases. At time t23, the control circuit 18c sets the control signals VC1 and VC4 at the high level H and maintains the control signals VC2 and VC3 at the low level L. Similarly to the case where the voltage G1 becomes the voltage Vin0 of the voltage Vin at time t16, the voltage G1 becomes Vin0+Vref, which is the voltage of the voltage Vin. The NFET M4 is turned on, and the voltage Vm at the node N3 becomes 0 V. The timing at which the control signal VC1 is set at the high level H and the timing at which the control signal VC4 is set at the high level H may be slightly different from each other as long as the voltage Vm at the node N3 can be appropriately set at 0 V. At time t24, the control circuit 18c sets the control signal VC4 at the low level L, maintains the control signal VC1 at the high level H, and maintains the control signals VC2 and VC3 at the low level L.

In the switching circuit of the second embodiment described in FIG. 5, when the voltage Vin is the voltage Vin0 and the PFET M1 is switched from the ON state to the OFF state at the above-described time t16, the voltage G1 is the voltage Vin0, the voltage difference between the source and the gate of the PFET M1 is substantially 0, and the PFET M1 is in the OFF state. Thereafter, after time t20, the voltage G1 maintains the voltage Vin0 even when the voltage Vin is not high. Therefore, the gate voltage becomes lower than the source voltage of the PFET M1. Thus, there is a possibility that the PFET M1 is turned on. When the PFET M1 is turned on, a current flows through the PFET M1, and the conversion efficiency of the voltage conversion circuit 12 decreases.

The comparator 16 compares the voltage Vm at the node N3 with the reference voltage Vref and outputs the comparison result to the control circuit 18c. This allows the determination circuit 15 to determine whether the voltage Vin has changed by a constant voltage corresponding to the reference voltage Vref from the voltage Vin0 to a higher voltage (a voltage farther from the reference potential 0V).

In the third embodiment, when the PFET M1 is in the OFF state, the determination circuit 15 determines whether the voltage Vin has changed by a constant voltage (Vref) from the voltage Vin0 (the voltage when the PFET M1 was switched from the ON state to the OFF state last time) to a higher voltage (a voltage farther from the reference potential 0 V). When it is determined that the voltage Vin has changed by the constant voltage (Vref), the control circuit 18c supplies the low level L (second level) to the control terminal TC1 and the high level H (fourth level) to the control terminal TC2, and then supplies the high level H (first level) to the control node TC1 and the low level L (third level) to the control terminal TC2. Accordingly, when the voltage Vin becomes higher than the voltage Vin0 by the reference voltage Vref or greater, the voltage G1 at the gate of the PFET M1 can be set at the voltage Vin again. Therefore, it is possible to prevent a micro current from flowing between the source and the drain of the FET M1 during a period in which the voltage Vin becomes higher than the voltage Vin0 and the FETM1 is originally controlled to be in the OFF state, thereby preventing the charge of the primary capacitor from flowing out. This prevents the conversion efficiency of the voltage conversion circuit 12 from decreasing.

In the third embodiment, the control signal Sh has a constant period, and as described above, the frequency thereof is preferably lower. However, when the control signal Sh and the reset signal Vr are generated substantially simultaneously, the operation according to the control signal Sh is prioritized.

FOURTH EMBODIMENT

Figure 9:
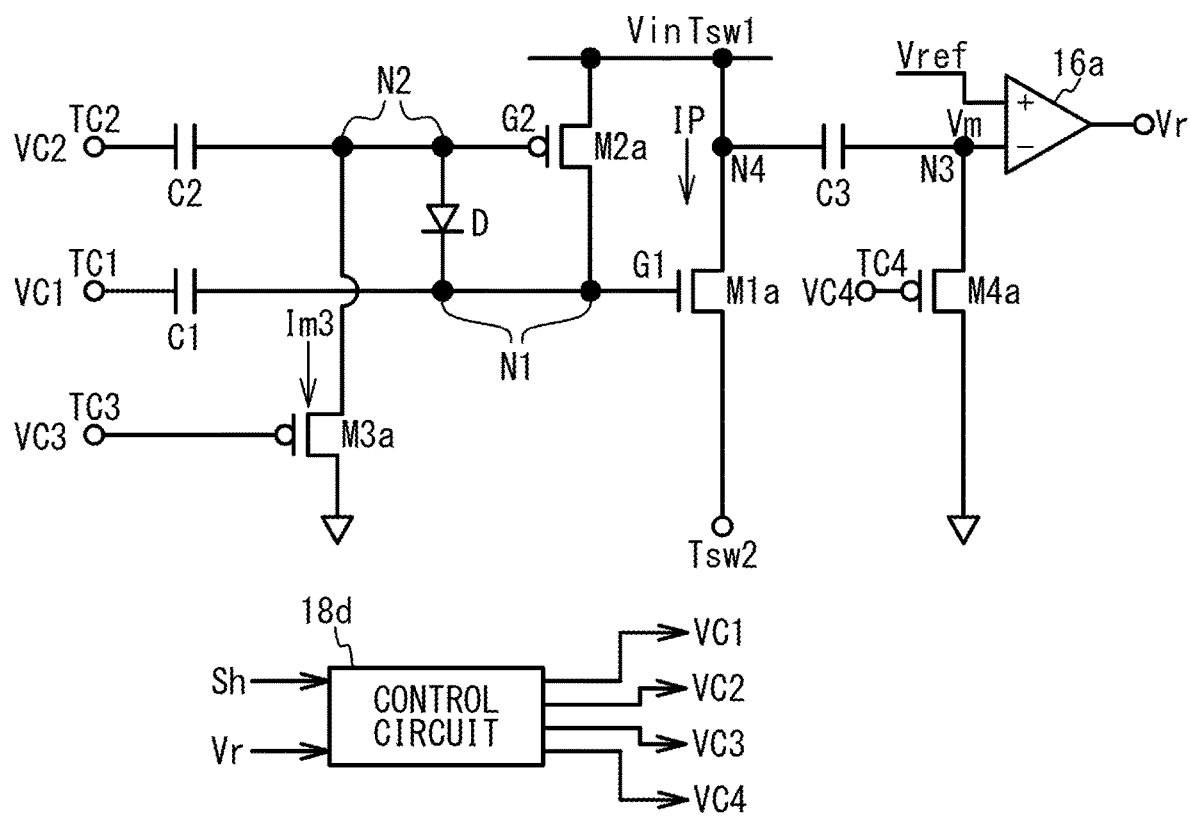
FIG. 9 is a detailed circuit diagram of a switching circuit constituting a power supply circuit in accordance with a fourth embodiment, and is a circuit diagram illustrating the details of a switch indicated as HSW in FIG. 1 and a control circuit thereof.

A fourth embodiment is an example in which the input voltage Vin from the power generation element 10 is lower than the ground potential. FIG. 9 is a detailed circuit diagram of a switching circuit constituting the power supply circuit of the fourth embodiment, and is a circuit diagram illustrating the details of the switch indicated as HSW in FIG. 1 and a control circuit thereof. As illustrated in FIG. 9, a switching circuit 28 of the fourth embodiment uses an NFET M1a, PFETs M2a, M3a, and M4a instead of the PFET M1, the NFETs M2, M3, and M4 illustrated in FIG. 7 of the third embodiment, respectively. The cathode of the diode D is connected to the node N1, the anode thereof is connected to the node N2, and a direction from the node N2 to the node N1 is a forward direction. The negative input terminal of a comparator 16a is connected to the node N3, and the reference voltage Vref is input to the positive input terminal. The control circuit is indicated by 18d. Other configurations are the same as those of the third embodiment illustrated in FIG. 7, and the description thereof is omitted. The high level H and the low level L of the control signals VC1 to VC4 are opposite to those in FIG. 8. The voltage X, the voltage Vin0 and the reference voltage Vref are negative.

As in the first to third embodiments, when the input voltage Vin is higher than that of the ground (reference potential), the first FET is the PFET M1, and the second FET and the third FET are the NFETs M2 and M3, respectively. The first level and the fourth level are the high levels H, and the second level and the third level are the low levels L. On the other hand, when the input voltage Vin is lower than that of the ground (reference potential), the first FET is the NFET M1a, and the second FET and the third FET are the PFETs M2a and M3a, respectively. The first level and the fourth level are the low levels L, and the second level and the third level are the high levels H. As described above, each of the second FET and the third FET is an NFET or a PFET having a conductive type of the channel opposite to that of the first FET.

In the first to fourth embodiments, the PFET is in the OFF state when the gate voltage (the voltage at the gate with respect to the source) is 0 V, and turns on when the gate voltage becomes lower than a negative threshold voltage. The NFET is in the OFF state when the gate voltage is 0 V and turns on when the gate voltage becomes higher than a positive threshold voltage. The PFET and the NFET are, for example, metal oxide semiconductor (MOS) FETs using silicon. The diode D is, for example, a diode in which an FET is diode-connected. Although the FET has been described as an example of the switching element, the switching element can be applied to the first to fourth embodiments as long as the switching element is a field-effect element that operates with the potential of the control terminal (gate) in a floating state. The switching element is only required to be a field-effect switching element in which a potential applied to the control terminal switches the conductive channel between the ON state and the OFF state in accordance with an electric field formed in the conductive channel. For example, a bipolar transistor combined with an FET or an insulated gate bipolar transistor (IGBT) may be used.

The high levels and the low levels of the control signals VC1 to VC4 are only required so that the high level is higher than the low level in the same control signal, and the voltages of the high levels of different control signals may be different from each other and the low levels may be different from each other.

Use of the switches of the first to fourth embodiments in the voltage conversion circuit 12 of FIG. 1 allows the switch of the voltage conversion circuit 12 to be stably controlled. Although FIG. 1 illustrates an example of a step-down/step-up voltage conversion circuit as a power supply circuit, the power supply circuit may be a step-down voltage conversion circuit, a step-up voltage conversion circuit, or an inverting voltage conversion circuit. The power supply circuit may be a power conversion circuit or the like that converts alternating current to direct current.

Figure 10A:
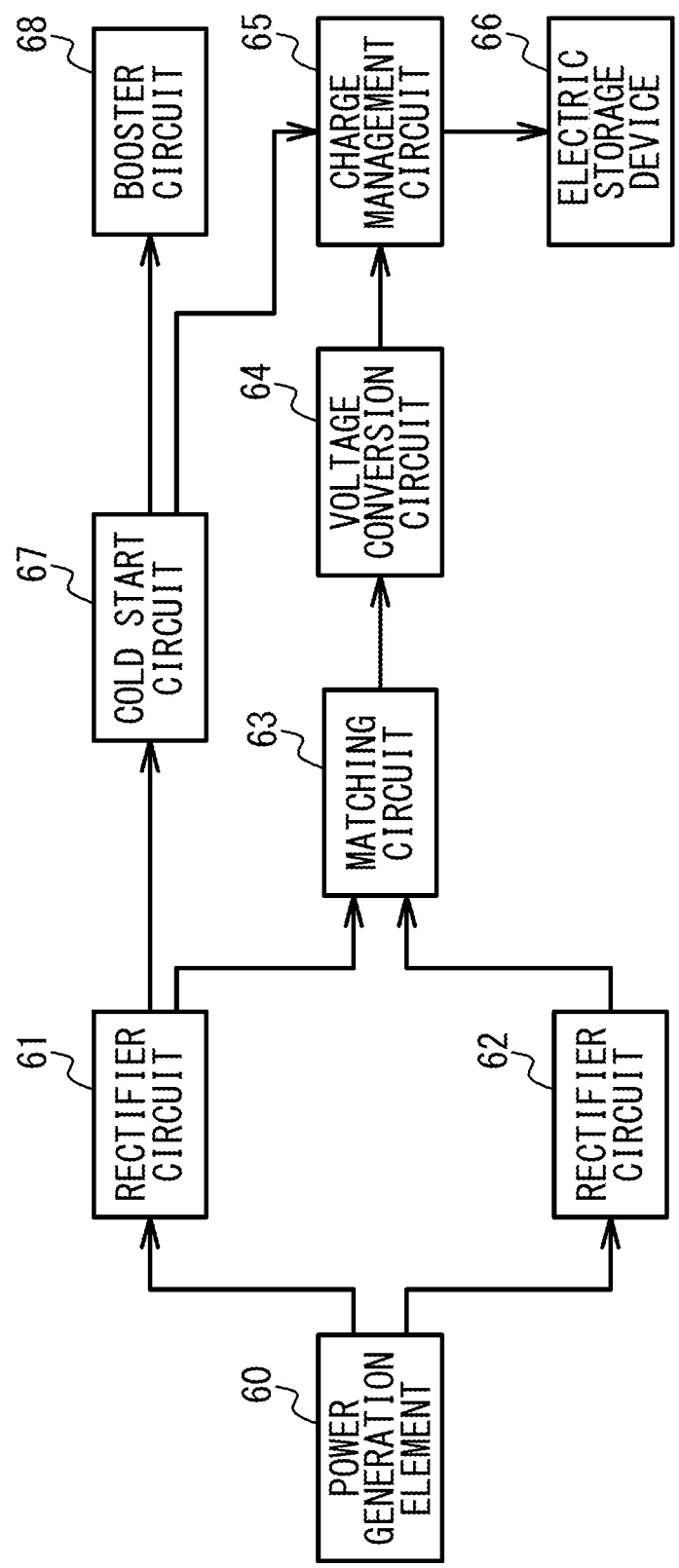
FIG. 10A is a block diagram illustrating an embodiment of a power supply circuit of the present invention, in which the switching circuit according to any one of the first to fourth embodiments and their variations is used in a voltage conversion circuit 64 thereof.

FIG. 10A is a block diagram illustrating an embodiment of a power supply circuit in accordance with the present invention, in which the switching circuit according to any one of the first to fourth embodiments and their variations is used in the voltage conversion circuit 64. As illustrated in FIG. 10A, the system includes a power generation element 60, rectifier circuits 61 and 62, a matching circuit 63, the voltage conversion circuit 64, a charge management circuit 65, an electric storage device 66, a cold start circuit 67, and a booster circuit 68.

The power generation element 60 is, for example, the power generation element 10 of FIG. 1, and generates AC power of a micro current. The rectifier circuit 61 is, for example, a diode bridge, and the rectifier circuit 62 is, for example, a synchronous rectifier circuit. The matching circuit 63 matches the output impedance of the rectifier circuits 61 and 62 with the input impedance of the voltage conversion circuit 64. The voltage conversion circuit 64 is, for example, the voltage conversion circuit 12 of FIG. 1, and is a DC-DC converter. The charge management circuit 65 stores electricity in an appropriate one of a plurality of the electric storage devices 66. The electric storage device 66 is, for example, a capacitor. The charge management circuit 65 monitors the voltages at both ends of the plurality of the electric storage devices and charges an appropriate electric storage device with the generated power. The cold start circuit 67 charges the electric storage device 66 with the output current of the rectifier circuit 61 when the electric storage device 66 is little charged. The booster circuit 68 is, for example, a charge pump, and generates a voltage used for the rectifier circuit 62, the voltage conversion circuit 64, and the like.

The operation of the system will now be described. When the power generation element 60 generates micro power in a state where the electric storage device 66 is little charged, the rectifier circuit 61 rectifies the micro power. The rectifier circuit 61 can perform rectification without an external power supply like a diode bridge. The current rectified by the rectifier circuit 61 reaches the charge management circuit 65 via the cold start circuit 67 and is stored in the electric storage device 66. When the electric storage device 66 is charged to a sufficient voltage, the booster circuit 68 boosts the voltage of the electric storage device 66 to a voltage used for the rectifier circuit 62 and the voltage conversion circuit 64. The voltage of the electric storage device 66 is, for example, 1 V, and the voltage output from the booster circuit 68 is, for example, 2 V. When the rectifier circuit 62 and the voltage conversion circuit 64 operate using the voltage of the electric storage device 66, the booster circuit 68 may be omitted.

The matching circuit 63 increases the input voltage when the amount of power generated by the power generation element 60 is large and the generated current is large, and decreases the input voltage when the amount of power generated by the power generation element 60 is small and the generated current is small. Thus, the output impedance of the power generation element 60 is matched with the input impedance of the rectifier circuits 61 and 62. The matching circuit 63 switches between the rectifier circuits 61 and 62 in accordance with the input voltage. For example, in the case that the rectifier circuits 61 and 62 are a diode bridge and a synchronous rectifier circuit, respectively, when the input voltage becomes equal to or lower than 1 V, the loss due to the on-voltage of the diode becomes large. Therefore, the rectifier circuit 62 is used. When the input voltage is equal to or higher than 1V, the rectifier circuit 61 is used.

The voltage conversion circuit 64 converts the input voltage set by the matching circuit 63 into a voltage with which the electric storage device 66 is charged. The voltage of the electric storage device 66 is, for example, 1 V or 3.3 V. The charge management circuit 65 monitors the voltages of the plurality of the electric storage devices 66 and charges an appropriate electric storage device 66 with the generated power.

In a system using the power generation element 60 that generates such a micro power, the input voltage of the voltage conversion circuit 64 varies. For this reason, the switch HSW (see FIG. 1), which is the high-side switch of the voltage conversion circuit 64, does not stably operate, and the conversion efficiency in the voltage conversion circuit 64 may decrease. By using the switching circuit according to any one of the first to fourth embodiments as the switch HSW of the voltage conversion circuit, the switch HSW can be stably controlled, and a decrease in the conversion efficiency of the voltage conversion circuit 64 can be reduced.

Figure 10B:
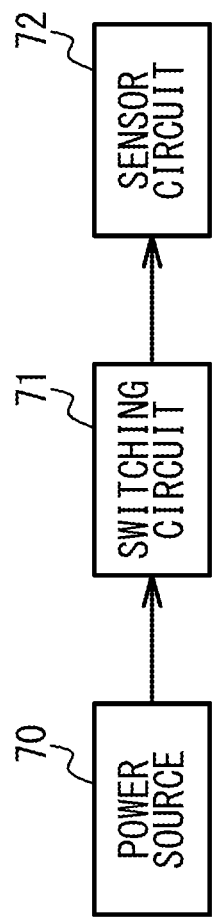
FIG. 10B is a block diagram illustrating a system of a sensor circuit in which the switching circuit according to any one of the first to fourth embodiments and their variations is used.

FIG. 10B is a block diagram illustrating a system of a sensor circuit in which the switching circuit according to any one of the first to fourth embodiments and the variations thereof is used. As illustrated in FIG. 10B, the switching element of a switching circuit 71 of the first to fourth embodiments turns on and off the power supply from a power supply 70 to a sensor circuit 72. As described above, the switching elements of the switching circuits of the first to fourth embodiments are not limited to an element that turns on and off the electromotive force supplied from the power generation element. The switching circuits of the first to fourth embodiments may be used for a circuit other than a power supply circuit, such as an Internet of Things (IoT) device or an edge device with low power consumption.

Although the preferred embodiments of the present invention have been described in detail above, the present invention is not limited to the specific embodiments, and various variations and changes can be made within the scope of the gist of the present invention described in the claims.

What is claimed is:

1. A switching circuit comprising:
a switching element of a field-effect type, the switching element being configured to switch between an ON state and an OFF state in accordance with a potential of a control terminal, and being connected between a first terminal and a second terminal; and
a control circuit configured to supply a potential of a first level to the control terminal when maintaining the ON state of the switching element, and make the control terminal floating after connecting the control terminal to the first terminal to supply a potential of the first terminal to the control terminal when switching the switching element from the ON state to the OFF state, the first level bringing the switching element into the ON state, the second level bringing the switching element into the OFF state.

2. The switching circuit according to claim 1, wherein the control circuit makes the control terminal floating after charging or discharging the control terminal via a resistor, and supplies a potential of the first level to the control terminal when switching the element from the OFF state to the ON state.

3. The switching circuit according to claim 1, wherein the switching element is an element that turns on and off an electromotive force supplied from a power generation element.

4. The switching circuit according to claim 3, wherein the power generation element is a vibration power generation element.

5. The switching circuit according to claim 1, wherein the switching element is an element that turns on and off power supply to a sensor circuit.

6. The switching circuit according to claim 1, further comprising a maintaining circuit configured to maintain a potential of the control terminal within a predetermined range.

7. The switching circuit according to claim 6, wherein the maintaining circuit includes a diode connected to the control terminal.

8. The switching circuit according to claim 1, wherein the switching element is a first FET having a source connected to a first terminal, a drain connected to a second terminal, and a gate connected to a first node capacitively coupled to a first control terminal.

9. A power supply circuit comprising the switching circuit according to claim 1.

10. A switching circuit comprising:
a first FET having a source connected to a first terminal, a drain connected to a second terminal, and a gate connected to a first node capacitively coupled to a first control terminal, the first FET being configured to switch between an ON state and an OFF state in accordance with a potential of the first gate,
a second FET having a source connected to the first node, a drain connected to the first terminal, and a gate, and
a control circuit configured to supply a potential of a first level to the first control terminal when maintaining the OFF state of the first FET, the first level bringing the first FET into the OFF state,
wherein the control circuit brings a state between the source and the drain of the second FET into an OFF state and connects the first node to a reference potential via a resistor to charge or discharge the first node, and then disconnects the first node from the first terminal and the reference potential to make the first control terminal floating and supplies the potential of a second level to the first control terminal when switching the first FET from the OFF state to the ON state, the second level bringing the first FET into the ON state.

11. The switching circuit according to claim 10, further comprising:
a third FET having a source connected to the reference potential, a drain connected to the first node, and a gate,
wherein the resistor is a resistor between the source and the drain of the third FET, and a saturation current flows through the third FET when the first node is connected to the reference potential via the second FET.

12. The switching circuit according to claim 10, further comprising:
a rectifier element in which a direction from the first node to a second node capacitively coupled to a second control terminal is a forward direction,
wherein the second FET is of an N-type, and the gate of the second FET is connected to the second node,
wherein the first FET is of a P-type, and
wherein the first node is connected to the reference potential via the rectifier element, the second node, and the resistor.

13. The switching circuit according to claim 12, wherein the control circuit supplies the potential of the second level to the first control terminal and supplies a potential of a third level to the second control terminal when the first FET is maintained in the ON state, and supplies a potential of a fourth level to the second control terminal and then supplies the potential of the first level to the first control terminal and the potential of the third level to the second control terminal, the third level bringing the second FET into the OFF state, the fourth level bringing the second FET into an ON state.

14. The switching circuit according to claim 13, wherein the control circuit supplies the potential of the first level to the first control terminal after supplying the potential of the third level to the second control terminal when switching the first FET from the ON state to the OFF state.

15. The switching circuit according to claim 13, further comprising:
a determination circuit configured to determine whether an input voltage input to the first terminal has changed by a predetermined voltage from an input voltage when the first FET was switched from the ON state to the OFF state last time, when the first FET is maintained in the OFF state,
wherein the control circuit supplies the potential of the second level to the first control terminal and supplies the potential of the fourth level to the second control terminal, and then supplies the potential of the first level to the first control terminal and supplies the potential of the third level to the second control terminal when it is determined that the input voltage has changed by the predetermined voltage.

16. The switching circuit according to claim 15, wherein the determination circuit includes a comparator configured to compare a voltage at a third node capacitively coupled to the first terminal with a constant voltage and output a comparison result to the control circuit.

17. The switching circuit according to claim 10, further comprising:
a rectifier element in which a direction from a second node capacitively coupled to a second control terminal to the first node is a forward direction,
wherein the second FET is of a P-type and is connected to a second node capacitively coupled to the second control terminal,
wherein the first FET is of an N-type, and
wherein the first node is connected to the reference potential via the rectifier element, the second node, and the resistor.

18. The switching circuit according to claim 10, wherein an input voltage input to the first terminal is higher than the reference potential, and the first FET is a PFET.

19. The switching circuit according to claim 10, wherein an input voltage input to the first terminal is lower than the reference potential, and the first FET is an NFET.

20. A switching circuit comprising:
a first FET having a source connected to a first terminal, a drain connected to a second terminal, and a first gate connected to a first node capacitively coupled to a first control terminal, the first FET being configured to switch between an ON state and an OFF state in accordance with a potential of the first gate,
a second FET having a source connected to the first node, a drain connected to the first terminal, and a second gate connected to a second node capacitively coupled to a second control terminal, and
a control circuit being configured to control the first and second FETs,
wherein the control circuit supplies a potential of a first level to the first node via the first control terminal when maintaining the ON state of the first FET, the first level bringing the first FET into the ON state, and supplies a potential that brings a state between the source and the drain of the second FET into an ON state to the second control node via the second control terminal such that the first and second nodes are connected to the first terminal via a resistor to charge or discharge the first and second nodes, and then supplies a potential that brings the state between the source and the drain of the second FET into an OFF state to the second node via the second control terminal such that the first and second nodes are disconnected from the first terminal to make the first and second nodes floating, and supplies the potential of a second level to the first control terminal after floating the first and second nodes when switching the first FET from the ON state to the OFF state, the second level bringing the first FET into the OFF state.

* * * * *